United States Patent [19]
Shoji et al.

[11] Patent Number: 5,323,031
[45] Date of Patent: Jun. 21, 1994

[54] BIPOLAR TRANSISTOR WITH A PARTICULAR SILICON GERMANIUM ALLOY STRUCTURE

[75] Inventors: Kenichi Shoji, Kokubunji; Akira Fukami, Kodaira; Takahiro Nagano, Hitachi, all of Japan

[73] Assignee: Hitachi, Ltd., Tokyo, Japan

[21] Appl. No.: 853,819

[22] Filed: Mar. 19, 1992

[30] Foreign Application Priority Data

Mar. 20, 1991 [JP] Japan .................. 3-057090

[51] Int. Cl.$^5$ .............. H01L 31/072; H01L 31/109; H01L 27/082; H01L 27/102
[52] U.S. Cl. ..................... 257/198; 257/197; 257/591; 257/592
[58] Field of Search ............ 257/198, 197, 616, 591, 257/592

[56] References Cited

U.S. PATENT DOCUMENTS 4,885,614 12/1989 Furukawa et al. .............. 257/198

FOREIGN PATENT DOCUMENTS 1-231371 9/1989 Japan .................. 257/197

Primary Examiner—Rolf Hille
Assistant Examiner—Wael Fahmy
Attorney, Agent, or Firm—Antonelli, Terry, Stout & Kraus

[57] ABSTRACT

To eliminate misfit dislocation occurring in a hetero-interface and to provide a bipolar transistor capable of a high speed operation, the bipolar transistor is configured such that the energy band gap is progressively narrowing from part of an emitter layer towards part of a collector layer through a base layer.

22 Claims, 18 Drawing Sheets

F I G. 5A
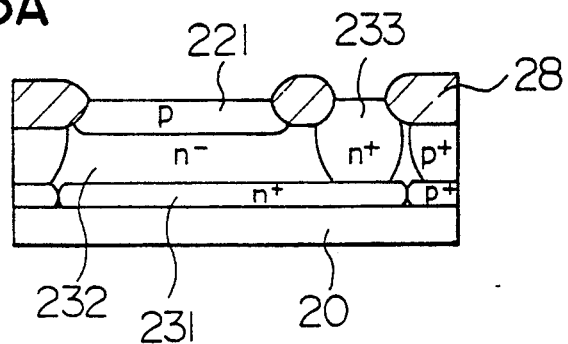
F I G. 5B
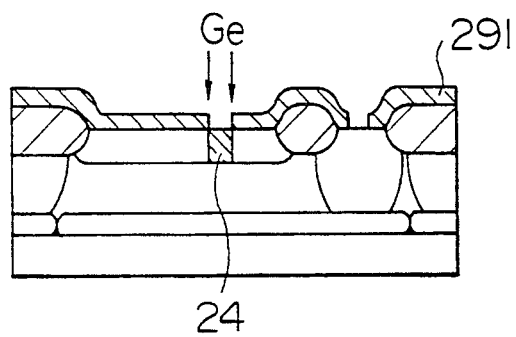
F I G. 5C
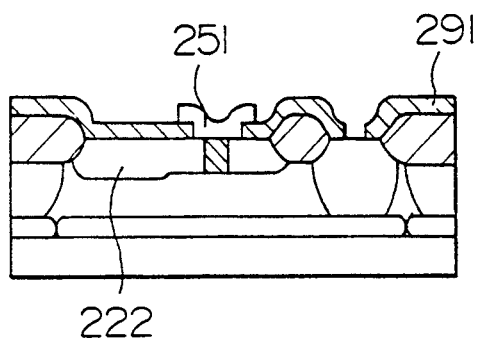
F I G. 5D
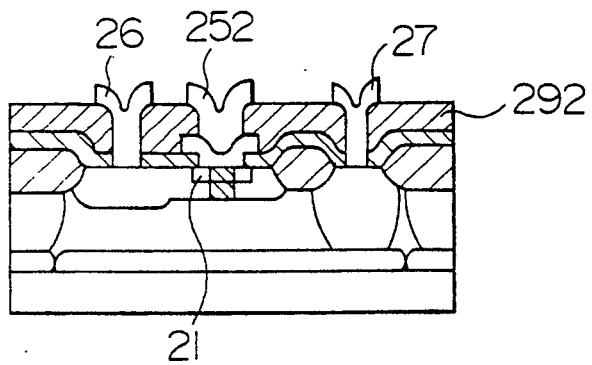

BIPOLAR TRANSISTOR WITH A PARTICULAR SILICON GERMANIUM ALLOY STRUCTURE

BACKGROUND OF THE INVENTION

The present invention relates to a bipolar transistor and, more particularly, to a heterojunction bipolar transistor and a fabrication method thereof.

When the delay time of a basic gate is compared in terms of a trend in a highly integrated memory of each generation, performance of a bipolar transistor must be improved in the same way as an MOS transistor in order to maintain a superiority of a BiCMOS gate over a CMOS gate in future. When the switching time is compared between the MOS transistor and the bipolar transistor that are used in the BiCMOS gate circuit, the switching speed of the bipolar transistor tends to decrease in the silicon system of the prior art although a high speed switching time can be accomplished in the MOS transistor with the scale-down of the transistor size and its lowering voltage.

One of the high speed bipolar transistors is a heterojunction bipolar transistor which has a difference of the band gap between its base region and emitter region. The characterizing feature of the heterojunction bipolar transistor is that a high current gain can be obtained by preventing the injection of majority carriers from the base region to the emitter region by utilizing the barrier height of the step of the band gap on the hetero-interface of the emitter-base junction. Consequently, since the base concentration can be set to a relatively higher concentration than in the conventional bipolar transistors, the base resistance can be reduced and higher speed performance of the bipolar transistor can be accomplished.

The structure of the conventional heterojunction bipolar transistor uses a silicon-germanium alloy ($Si_{1-x}Ge_x$) for its base region, and FIG. 19 shows its sectional view. Reference numeral 2 in the drawing represents an n+-Si collector region, 3 is a p-$Si_{1-x}Ge_x$ base region, 4 is n+-Si emitter region, 5 is an emitter electrode, 6 is a base electrode and 7 is a collector electrode. Among them, the X value of $Si_{1-x}Ge_x$ in the base region is increased from the emitter region side towards the collector region side and the energy band gap becomes narrower from the emitter region side towards the collector region side. Therefore, a drift field is generated in the base region, so that the base transit time of the minority carriers can be shortened and high speed performance of the bipolar transistor can thus be accomplished.

A heterojunction bipolar transistor using the silicon-germanium alloy ($Si_{1-x}Ge_x$) for the base is described, for example, in JP-A-1-231371.

According to the prior art described above, since the band gap of the emitter and base regions sharply changes at the emitter-base junction, misfit dislocations resulting from the lattice mismatch between silicon and germanium occur in the active regions of the bipolar transistor and problems such as a drop of high speed performance voltage breakdown of the bipolar transistor and an increase of the leakage current result.

Generally, in hetero-epitaxy of lattice mismatched materials such as silicon and germanium, a growth layer coherently grows without generating misfit dislocations and the lattice mismatch is mitigated by a strain in the lattice when a film thickness is below a thickness approximate to a super-lattice, but when the growth layer grows into a thickness about the film thickness necessary for constituting the bipolar transistor, the lattice mismatch invites the strain in the lattice and the misfit dislocations. The occurrence of the misfit dislocations which exerts adverse influences on the electrical characteristics is a critical problem which is unavoidable when a hetero-material of the silicon-germanium alloy ($Si_{1-x}Ge_x$) is injected into the Si system bipolar transistor.

SUMMARY OF THE INVENTION

It is an object of the present invention to provide a bipolar transistor minimizing the influences of the misfit dislocations which occur when the hetero-junction is formed, and a fabrication method suitable for the bipolar transistor.

The characterizing structure of the bipolar transistor according to one feature of the present invention resides in that an energy band gap in the emitter and base regions near a base-emitter junction is narrowing from the emitter region side towards the base region side.

Specifically, regarding the characterizing structure of the bipolar transistor according to another feature of the present invention, the emitter region and the base region near the base-emitter junction include an alloy of silicon and germanium, and the concentration of germanium progressively increases from the emitter region side towards the base region side. The silicon-germanium alloy region is preferably disposed in a spaced-apart relation from an exposed end of the base-emitter junction. More preferably, at least the alloy region contains an element or elements having a smaller lattice constant than silicon, such as the element(s) selected from the group essentially consisting of carbon, boron and nitrogen.

The characterizing feature of the fabrication method of a bipolar transistor according to another feature of the present invention comprises a first step of preparing a silicon substrate having a region to serve as a base of the transistor and a region to serve as a collector of the transistor that are sequentially formed on one of main surfaces of the silicon substrate, a second step of forming a mask having a window on one main surface of the silicon substrate, and forming a silicon-germanium alloy region in which the germanium concentration increases progressively away from one main surface of the substrate inside the region to serve as the base by injecting germanium into at least the region to serve as the base from the window of the mask, and a third step of injecting an impurity from the window of the mask to form a region to serve as an emitter of the transistor so that the base-emitter junction is positioned in the silicon-germanium alloy region. Preferably, this fabrication method includes also a step of making the window of the mask in the third step greater than the window of the mask in the second step and injecting an element or elements having a smaller lattice constant than that of silicon into the region to serve as the emitter.

The bipolar transistor according to one feature of the invention has a structure in which the energy band gap decreases progressively from the emitter region side towards the base region side. Therefore, the generation of the misfit dislocations at the emitter-base junction can be prevented and the problems with the prior art, that is, degradation of the electrical characteristics in the hetero-interface or in other words, the drop of high speed performance and the increase of the leakage current, can be eliminated, so that high-speed performance of the bipolar transistor can be improved. Since the band gap inside the base is changed, too, the high speed performance of the bipolar transistor can further be enhanced by the effective drift field in the base region.

Since carbon (C) having a function of widening the band gap is injected into the emitter region side, the barrier height of the valence band at the emitter-base junction becomes great, so that the current gain is improved and the high speed performance of the bipolar transistor is enhanced. The same effect can be obtained by injecting two elements having a smaller lattice constant than that of silicon as when carbon (C) is injected.

From the aspect of the structure, the bipolar transistor according to the present invention keeps the emitter-base junction away from the misfit dislocations occurring on the surface of the silicon-germanium alloy region by making the area of the emitter region on the substrate surface greater than the area of the silicon-germanium alloy ($Si_{1-x}Ge_x$) region, and can limit the degradation of the electrical characteristics of the bipolar transistor due to the misfit dislocations.

Since carbon (C) is an element of the Group IV in the same way as silicon and germanium, and is electrically intrinsic and has a lattice constant smaller than that of silicon, the injection of carbon into the substrate surface provides the effect of suppressing the occurrence of the misfit dislocations on the surface of the silicon-germanium alloy region by mitigating the strain resulting from the lattice mismatch between silicon and germanium.

The injection of two elements having a smaller lattice constant than that of silicon into the substrate surface provides a greater suppression effect of the misfit dislocations than the injection of carbon because the two elements (such as boron (B) and nitrogen (N)) having ion bondability make re-construction of the silicon-germanium alloy easier than carbon (C) which is a covalent bondable element having high bonding power.

Widening of the width of the substrate surface layer in the base region in a silicon-germanium alloy base lateral hetero-junction bipolar transistor keeps the emitter-base junction as well as the base-collector junction away from the misfit dislocations, suppresses the occurrence of any excessive current at the emitter-base junction and reduces the occurrence of the leakage current at the base-collector junction.

BRIEF DESCRIPTION OF THE DRAWINGS

FIGS. 5A-5D are fabrication process diagrams of the bipolar transistor of FIG. 4.

DESCRIPTION OF THE PREFERRED EMBODIMENTS

Hereinafter, embodiments of the present invention will be explained with reference to the accompanying drawings. Although the explanation will be given about an NPN bipolar transistor only by way of example for the purpose of simplification, it also holds true of a PNP transistor.

Figure 1A:
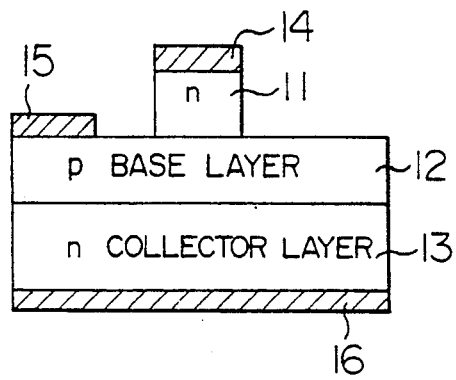
FIGS. 1A-1E are conceptual views of a bipolar transistor according to an embodiment of the present invention, a germanium concentration distribution diagram and an energy band diagrams.
Figure 1B:
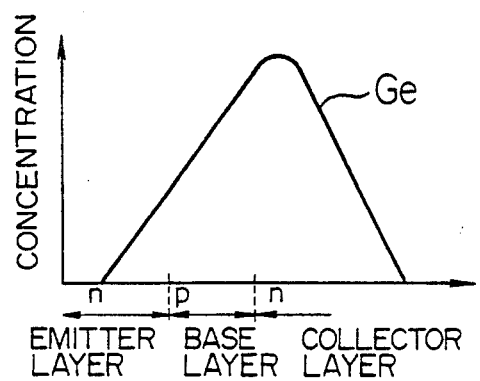
Figure 1C:
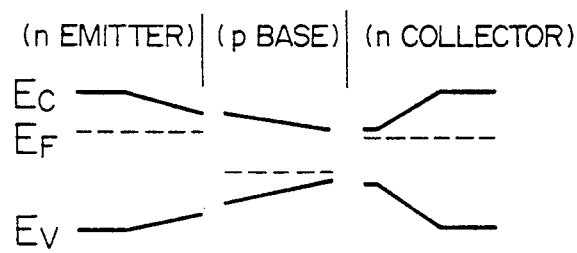
Figure 1D:
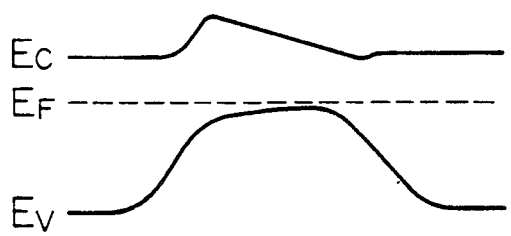
Figure 1E:
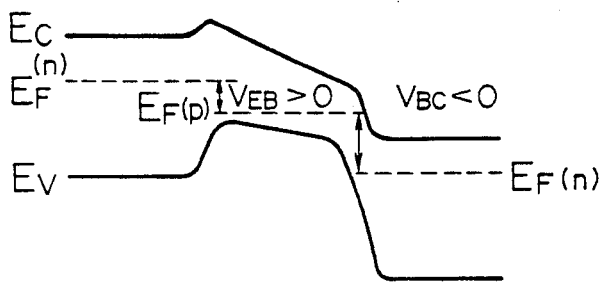

FIGS. 1A-1E show an embodiment of the bipolar transistor of the present invention. FIG. 1A is a conceptual view of the bipolar transistor, FIG. 1B shows a concentration distribution of germanium (Ge) inside silicon (Si), FIG. 1C is an energy band diagram under a flat band state before a junction is formed, FIG. 1D shows the state of the energy band before an impressed voltage is applied, and FIG. 1E shows the state of the energy band when the impressed voltage is applied. It is possible to eliminate the occurrence of a misfit dislocation at an emitter-base junction and to let the bipolar transistor in this embodiment fully exhibit its high speed performance by progressively narrowing the band gap from part of an emitter region 11 to part of a collector region 13 through a base region 12 as shown in FIG. 1C. In FIG. 1A, reference numeral 14 denotes an emitter electrode, 15 is a base electrode and 16 is a collector electrode.

Figure 2A:
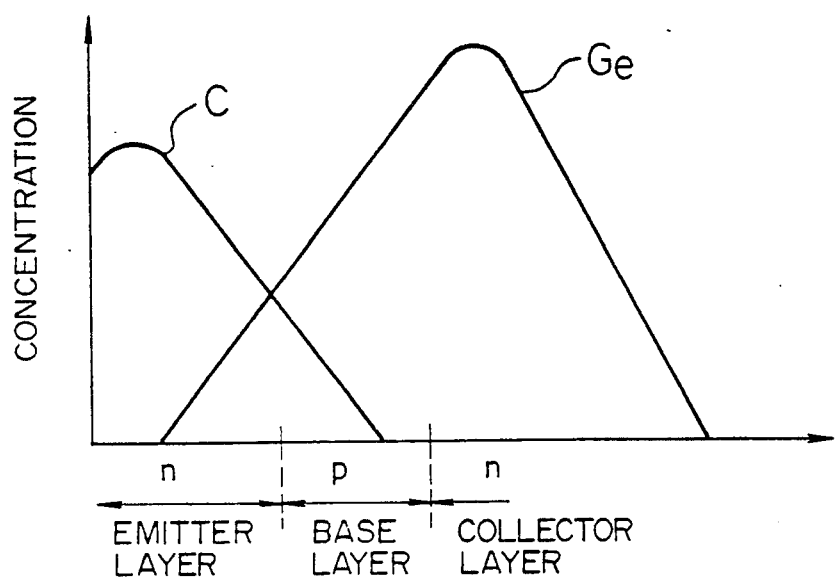
FIGS. 2A-2B are a concentration distribution diagram of a bipolar transistor as a modification of the first embodiment and its energy band diagram.
Figure 2B:
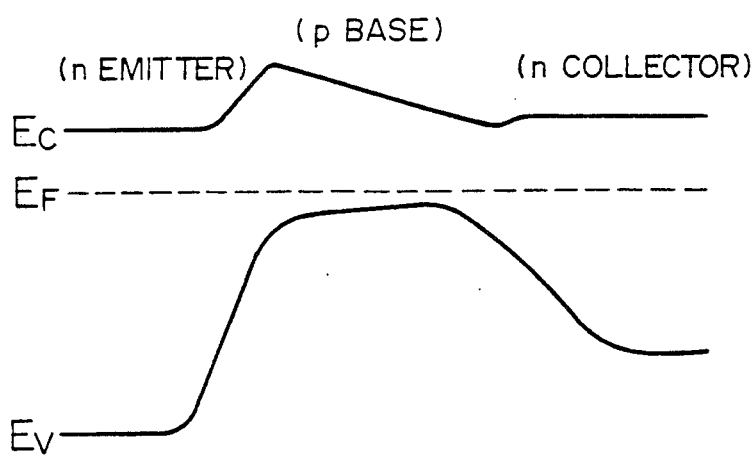

FIGS. 2A-2B show a bipolar transistor as a modification of the embodiment shown in FIGS. 1A-1E. FIG. 2A shows a concentration distribution of germanium (Ge) and carbon (C) inside silicon (Si), and FIG. 2B shows the state of the energy band before the impressed voltage is applied. A bipolar transistor having a high current gain and capable of a high speed operation can be accomplished by thus doping carbon (C) into the emitter region and increasing much more the barrier height of a valence band near the emitter-base junction.

Figure 3A:
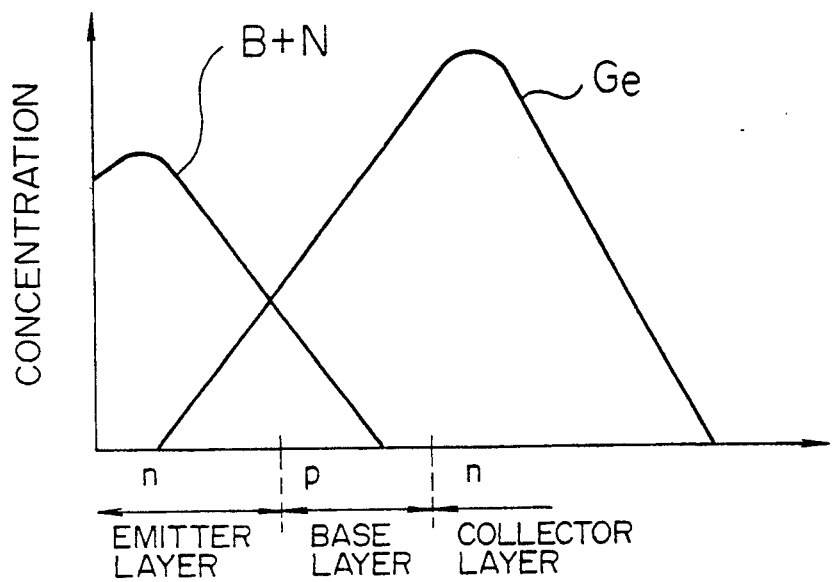
FIGS. 3A-3B are a concentration distribution diagram of a bipolar transistor as another modification of the first embodiment and its energy band diagram.
Figure 3B:
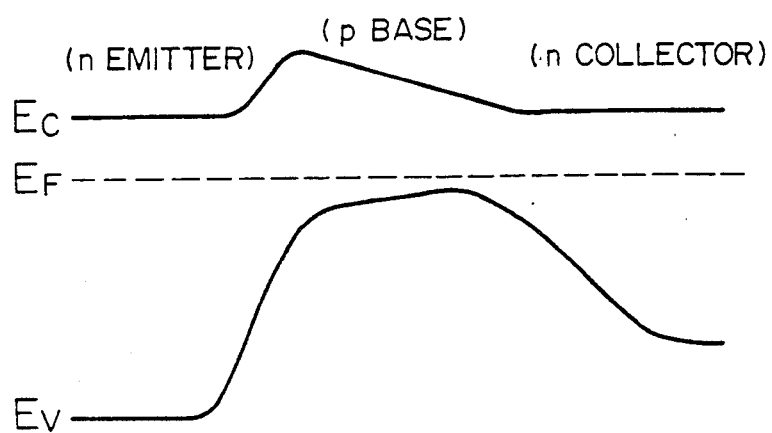

FIGS. 3A-3B show a bipolar transistor as another modification of the embodiment shown in FIGS. 1A-1E. FIG. 3A shows a concentration distribution of germanium (Ge), boron (B) and nitrogen (N) inside silicon (Si), and FIG. 3B shows the state of the energy band before the impressed voltage is applied. A bipolar transistor having a high current gain and capable of a high speed operation can be accomplished by thus doping boron (B) and nitrogen (N) having a smaller atomic radius than silicon (Si) into the emitter and increasing much more the barrier height of the valence band near the emitter-base junction.

Embodiment 2

Figure 4A:
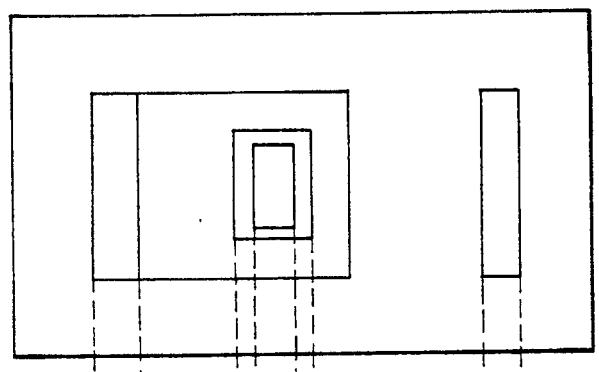
FIGS. 4A-4B are a plan view and a sectional view of a bipolar transistor according to another embodiment of the present invention.
Figure 4B:
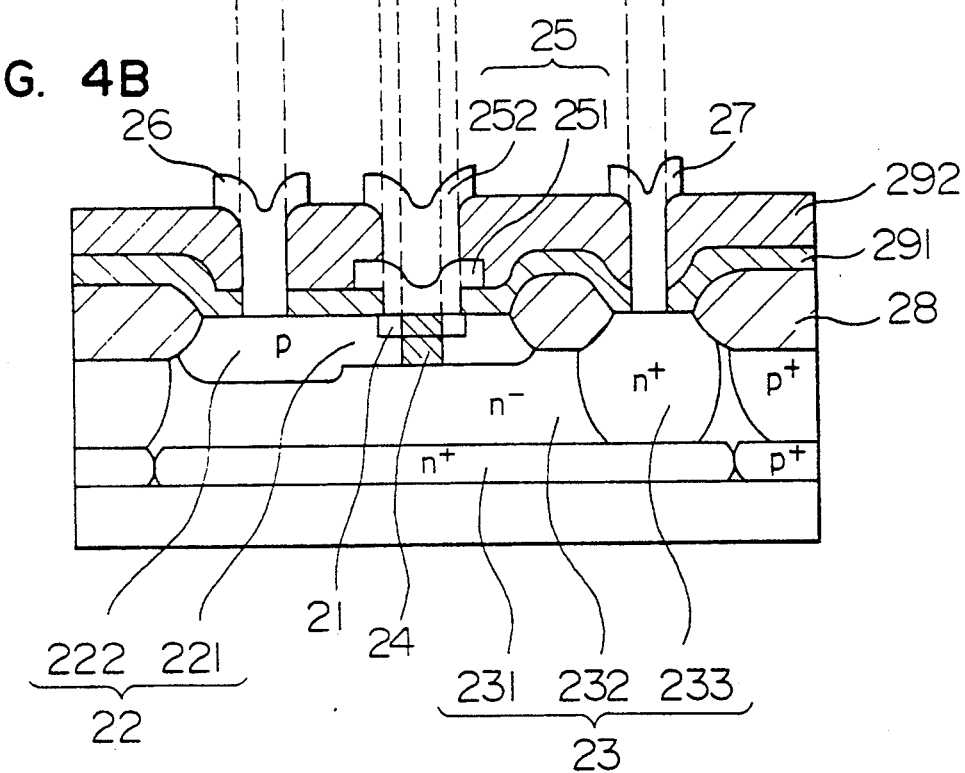

FIGS. 4A-4B show a structure of a bipolar transistor according to another embodiment of the present invention.

FIG. 4A is a plan view and FIG. 4B is a sectional view. The characteristic feature of the present bipolar transistor resides in the structure wherein an emitter region 21 encompasses the surface layer of a silicon-germanium alloy ($Si_{1-x}Ge_x$) region 24 locally formed inside a base region 22 and the emitter region 21. Since the base-emitter junction is spaced apart from the silicon-germanium alloy region 24 in which misfit dislocation is likely to occur, on the main plane, the structure prevents degradation of electrical characteristics of the bipolar transistor resulting from the misfit dislocation. Reference numeral 23 represents a collector region, 25 is the emitter electrode, 26 is a base electrode, 27 is a collector electrode, 28 is a field oxide film, 291 is an oxide film for inter-level insulation, and 292 is a surface stabilization film.

FIGS. 5A-5D show a fabrication process of the bipolar transistor shown in FIGS. 4A-4B.

In FIG. 5A, an n.-buried layer 231 and an n-collector 232 are formed on an Si substrate 20, and a field oxide film 28 is formed on field regions of the bipolar transistor. A P-type base region 221 is formed on one of the sides and an n+-collector plug (e.g., collector lead-out region) 233, on the other side. In FIG. 5B, after the oxide film 291 is formed, its predetermined region is opened and germanium ion implantation is carried out. In this instance, ion implantation is preferably carried out while cooling an Si substrate to a low temperature (below 0° C.). In FIG. 5C, after a base extension region 222 to the outside is formed and a window of the oxide film 291 is widened, polycrystalline silicon 251 is deposited and arsenic is ion-implanted for doping an emitter region. Polycrystalline silicon 251 is etched in such a manner as to cover the window. In FIG. 5D, after the surface stabilization film 292 is deposited, annealing is carried out so as to activate the implanted ions and to shallowly diffuse arsenic in polycrystalline silicon into the base region 221. Finally, predetermined regions of the oxide film 291 for inter-level insulation and surface stabilization film 292 are opened and an emitter electrode 252 is formed on polycrystalline silicon 251, furthermore, the base electrode 26 is formed on an external base extension region 222 and a collector electrode 27 is formed on the collector plug 233.

Figure 6A:
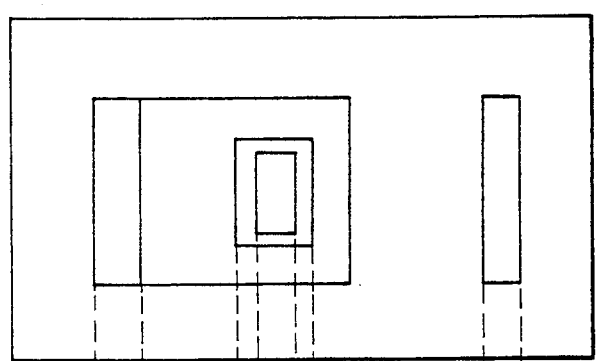
FIGS. 6A-6B are a view and a sectional view of a bipolar transistor as a modification of the embodiment of FIG. 4.
Figure 6B:
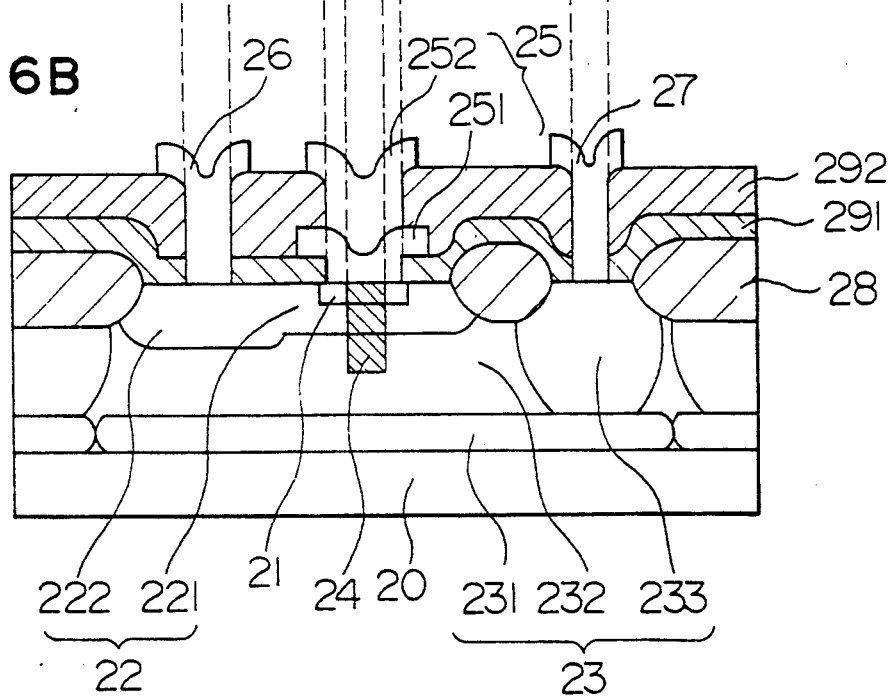

FIGS. 6A-6B show a structure of the bipolar transistor as a modification of the embodiment shown in FIGS. 4A-4B. FIG. 6A is a plan view and FIG. 6B is a sectional view. In comparison with FIGS. 4A-4B, the characterizing feature of this embodiment resides in that the silicon-germanium alloy ($Si_{1-x}Ge_x$) region 24 reaches the n⁻-collector layer 232 of the collector region 23. Since the silicon-germanium alloy ($Si_{1-x}Ge_x$) region 24 expands up to the base region 22 and to the collector region 23, a sharp hetero-interface does not exist at the base-collector junction; hence, the reduction of the leakage current in the opposite direction can be accomplished.

FIGS. 7A-7D show a fabrication process of the bipolar transistor shown in FIGS. 6A-6B.

Figure 7A:
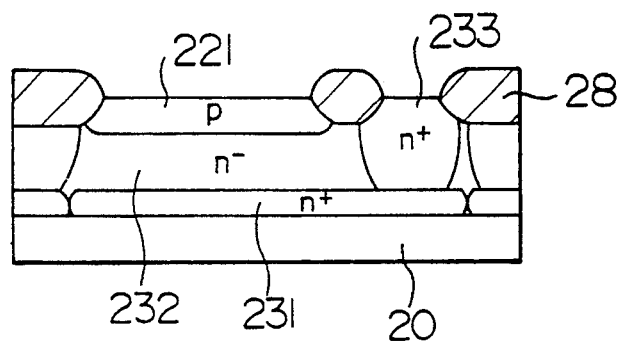
FIGS. 7A-7B are fabrication process diagrams of the bipolar transistor of FIG. 6.
Figure 7B:
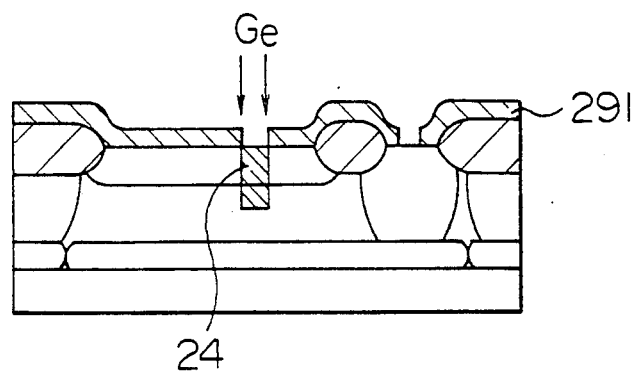
Figure 7C:
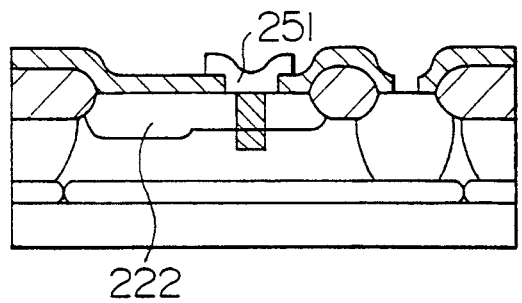
Figure 7D:
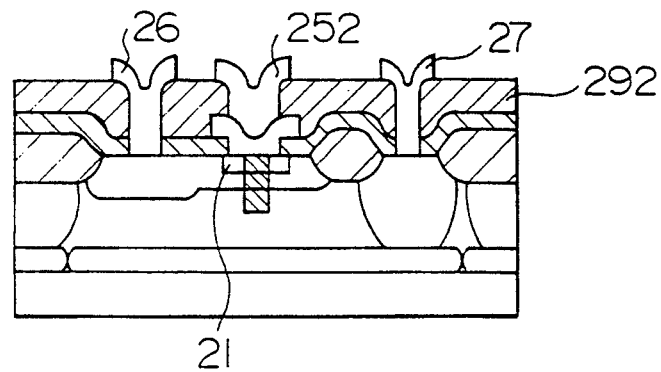

In FIG. 7A, the n⁻-buried layer 231 and the n⁻-collector layer 232 are formed on the Si substrate 20, and the field oxide film 28 is formed on the field regions of the bipolar transistor. The p-base layer 22 and the collector plug n+-region 233 are formed at the portions where the field oxide film 28 does not exist. In FIG. 7B, the oxide film 291 is formed and its predetermined region is opened. Then, ion implantation of the germanium ion is carried out. At this time, ion implantation is carried out so that the germanium ion can be injected into the n⁻-collector layer 232. In FIG. 7C, after the base extension region 222 to the outside is formed and the window of the oxide film 291 is widened, polycrystalline silicon 251 is deposited, and arsenic is ion-implanted for doping the emitter region. Polycrystalline silicon 251 is etched in such a manner as to cover the window. In FIG. 7D, after the surface stabilization film 292 is deposited, annealing is carried out in order to activate the ions and to shallowly diffuse arsenic in polycrystalline silicon into the base region 221. Finally, the predetermined regions of the oxide film 291 for inter-level insulation and the surface stabilization film 292 are opened and the emitter electrode 252 is formed on polycrystalline silicon 251. Furthermore, the base electrode 26 is formed on the external base extension region 222 and the collector electrode 27 is formed on the collector plug 233.

FIGS. 8A-8D show a structure of the bipolar transistor as still another modification of the embodiment shown in FIGS. 4A-4B and its fabrication process. The bipolar transistor according to this modification is featured in that carbon (C) is doped into the emitter region 21 and the surface of the silicon-germanium ($Si_{1-x}Ge_x$) alloy region 24. The strain in the lattice resulting from the lattice mismatch between silicon and germanium can be mitigated by introducing carbon (C) having a smaller lattice constant than silicon, so that the density of the misfit dislocation occurring in the surface layer of the silicon-germanium alloy ($Si_{1-x}Ge_x$) is reduced and the electrical characteristics at the junction between polycrystalline silicon 251 and the emitter region 21 can be improved.

Figure 8A:
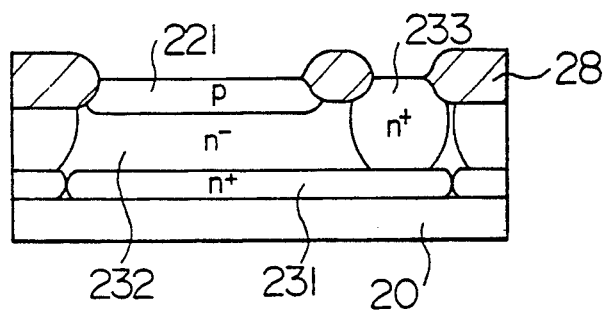
FIGS. 8A-8D are fabrication process diagrams of a bipolar transistor as another modification of the embodiment of FIG. 4.
Figure 8B:
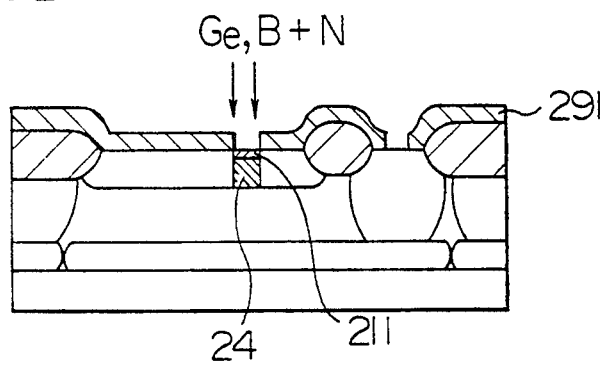
Figure 8C:
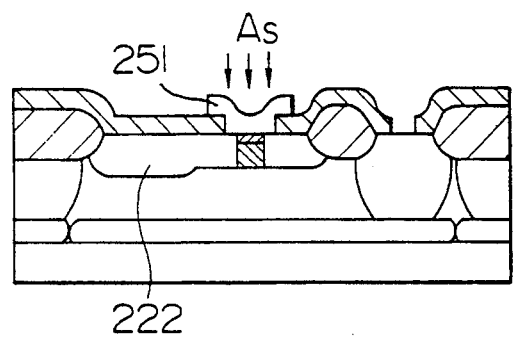
Figure 8D:
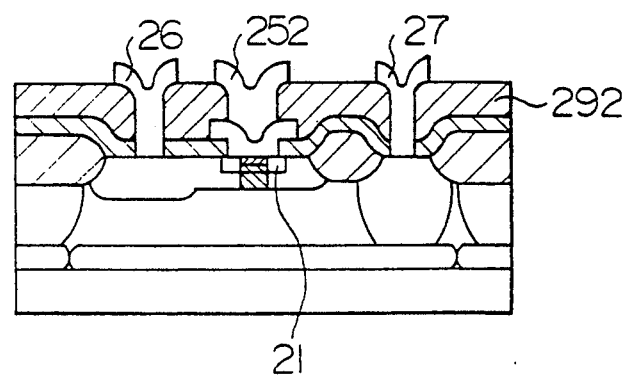

In FIG. 8A, the n+-buried layer 231 and the n⁻-collector layer 232 are formed on the Si substrate 20 and the field oxide film 28 is formed on the field regions of the bipolar transistor. The p-base layer 221 is formed on one of the sides and the n+-collector plug 233 is formed on the other side. In FIG. 8B, after the oxide film 291 is formed and its predetermined region is opened, germanium is ion-implanted. Further, carbon (C) for mitigating the crystal strain is ion-implanted. In FIG. 8C, after external base extension region 222 is formed and the window of the oxide film 291 is widened, polycrystalline silicon 251 is deposited and arsenic is ion-implanted for doping the emitter. Polycrystalline silicon 251 is then etched in such a manner as to cover the window. In FIG. 8D, the surface stabilization film 292 is deposited and then annealing is carried out so as to activate the implanted ions and to shallowly diffuse arsenic in polycrystalline silicon into the base layer 221. On the surface layer is formed a diffusion layer 211 including $Si_{1-x}Ge_x$:C containing carbon (C) at this time. Finally, the predetermined regions 211 of the oxide film 291 for inter-level insulation and surface stabilization film 292 are opened and the emitter electrode 252 is formed on polycrystalline silicon 251. Furthermore, the base electrode 26 is formed on the external base extension region 222 and the collector electrode 27, on the collector plug 233.

FIGS. 9A–9D show a structure of the bipolar transistor as still different modification of the embodiment shown in FIGS. 4A–4B and its fabrication process. The bipolar transistor according to this modification is featured in that boron (B) and nitrogen (N) are doped into the surfaces of the emitter region 21 and silicon-germanium alloy $(Si_{1-x}Ge_1)$ region 24. The crystal strain resulting from the lattice mismatch between silicon and germanium is mitigated by introducing B and N having a smaller lattice constant than silicon, so that the density of the misfit dislocation occurring in the surface layer of the silicon-germanium alloy $(Si_{1-x}Ge_x)$ is reduced and the electrical characteristics at the junction between polycrystalline silicon 251 and the emitter region 21 can be improved.

Figure 9A:
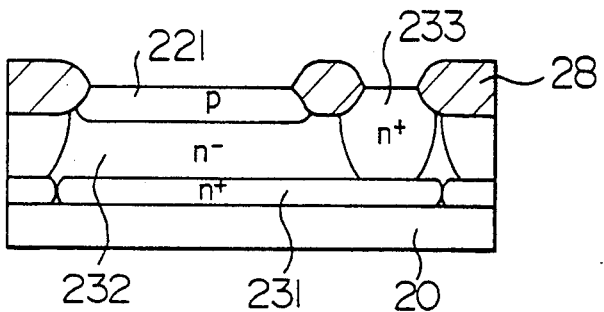
FIGS. 9A-9D are fabrication process diagrams of a bipolar transistor as a further different modification of the embodiment of FIG. 4.
Figure 9B:
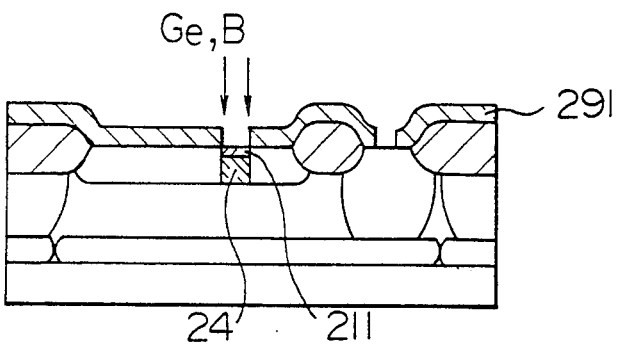
Figure 9C:
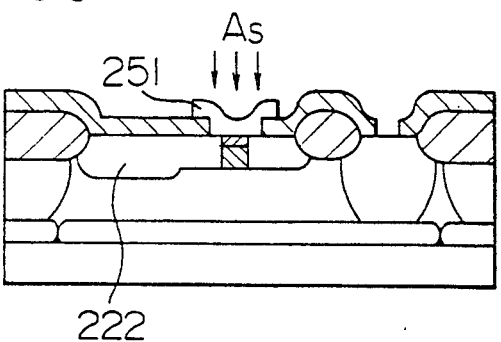
Figure 9D:
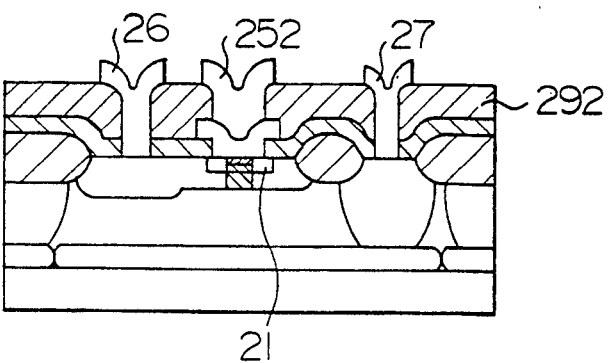

In FIG. 9A, the n+-buried layer 231 and the n−-collector layer 232 are formed on the Si substrate 20, and the field oxide film 28 is formed on field regions of the bipolar transistor. The p-base layer 221 is formed on one of the sides and the n+-collector plug 233, on the other. In FIG. 9B, after the oxide film 291 is formed and its predetermined region is opened, germanium is ion-implanted. Furthermore, B and N for mitigating the crystal strain are ion-implanted. In FIG. 9C, the external base extension region 222 is formed and after the window of the oxide film 291 is widened, polycrystalline silicon 251 is deposited and arsenic for doping the emitter is ion-implanted. Polycrystalline silicon 251 is etched in such a manner as to cover the window. In FIG. 9D, after the surface stabilization film 292 is deposited, annealing is carried out in order to activate the implanted ions and to shallowly diffuse arsenic in polycrystalline silicon into the base layer 221. On the surface layer is formed the diffusion layer 211 including $Si_{1-x}Ge_x$: BN containing B and N at this time. Finally, the predetermined regions of the oxide film 291 for interlevel insulation and the surface stabilization film 292 are opened, and the emitter electrode 252 is formed onpolycrystalline silicon 251. furthermore, the base electrode 26 is formed on the external base extension region 222 and the collector electrode 27, on the collector plug 233.

FIGS. 10A–10D show a bipolar transistor as still another modification of the embodiment shown in FIGS. 4A–4B and its fabrication process. The bipolar transistor according to this modification is featured in that carbon (C) is doped into the surfaces of the emitter region and silicon-germanium alloy $(Si_{1-x}Ge_x)$ region. The crystal strain resulting from the lattice mismatch between silicon and germanium is mitigated by doping carbon (C) having a smaller lattice constant than silicon, so that the density of the misfit dislocation occurring in the surface layer of the silicon-germanium alloy $(Si_{1-x}Ge_x)$ is reduced and the electrical characteristics at the junction between polycrystalline silicon 251 and the emitter region 21 can be improved. Furthermore, due to the decrease of the misfit dislocation of the surface layer, the base-emitter junction is not much affected adversely by the misfit dislocation even when the areas of the emitter region and silicon-germanium alloy $(Si_{1-x}Ge_x)$ on the surface side are made equal to each other. Therefore, their areas are made to be equal in this embodiment. As a result, the step of widening the window of the emitter can be omitted and the fabrication process can be simplified.

Figure 10A:
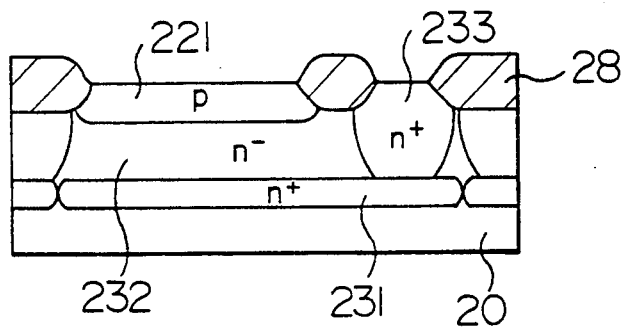
FIGS. 10A-10D are fabrication process diagrams of a bipolar transistor as still another modified embodiment of the embodiment of FIG. 4.
Figure 10B:
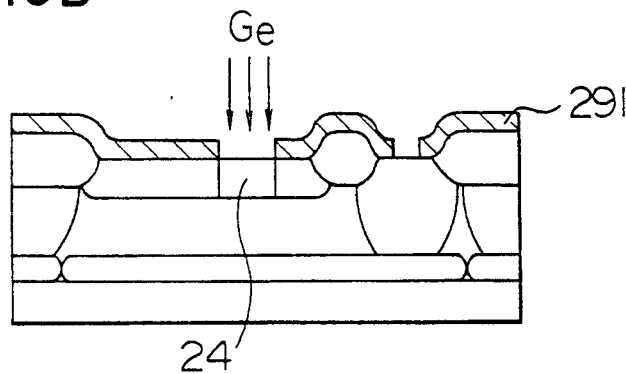
Figure 10C:
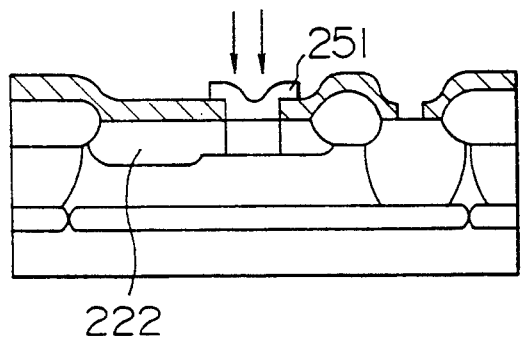
Figure 10D:
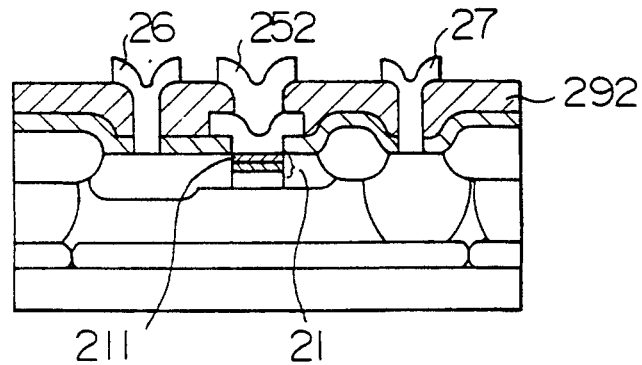

In FIG. 10A, the n+-buried layer 231 and the n−-collector layer 232 are formed on the Si substrate 20, and the field oxide film 291 is formed on the field regions of the bipolar transistor. The p-base layer 221 is formed on one of the sides and the N+ collector plug 233, on the other side. In FIG. 20B, the oxide film 291 is formed and its predetermined regions are opened. Germanium ion is then ion implanted. In FIG. 10C, after the external base extension region 222 is formed, polycrystalline silicon 251 is deposited without widening the window of the oxide film 291, and arsenic for doping the emitter and carbon (C) for mitigating the crystal strain are ion-implanted. Polycrystalline silicon 251 is then etched in such a manner as to cover the window. In FIG. 10D, after the surface stabilization film 292 is formed, annealing is carried out in order to activate the implanted ions and to shallowly diffuse arsenic in polycrystalline silicon into the base layer 221. On the surface layer 211 is formed the diffusion layer $Si_{1-x}Ge_x$:C containing carbon (C) at this time. Finally, the predetermined regions of the oxide film 291 for interlevel insulation and the surface stabilization film 292 are opened, and the emitter electrode 252 is formed on polycrystalline silicon 251. Furthermore, the base electrode 26 is formed on the external base extension region 222 and the collector electrode 27 is formed on the collector plug 233.

A greater effect can be expected by the use of two elements of boron (B) and nitrogen (N) having a smaller lattice constant than silicon in place of carbon (C).

FIG. 11A–11D show a structure of the bipolar transistor as still another modification of the embodiment shown in FIGS. 4A–4B and its fabrication process. The bipolar transistor according to the modification is featured in that carbon is doped into the surfaces of the emitter region and silicon-germanium alloy $(Si_{1-x}Ge_x)$ region. In the same way as in FIGS. 3A–3B, 4A–4B, 5A–5D and 6A–6B, the crystal strain resulting from the lattice mismatch between silicon and germanium is mitigated by doping carbon having a smaller lattice constant than silicon, so that the density of the misfit dislocation occurring in the surface layer of the silicon-germanium alloy $(Si_{1-x}Ge_x)$ 24 is reduced and the electrical characteristics at the junction between polycrystalline silicon 251 and the emitter region 21 can be improved However, the difference from FIG. 10A–10D is that the step of doping carbon (C) and the step of forming the emitter region 21 are reversed. According to this arrangement, since germanium (Ge) and carbon (C) can simultaneously be crystallized, crystallinity of the layer made of $Si_{1-x}Ge_x$:C can be improved and the doping effect of carbon (C) becomes more distinctive. Furthermore, since carbon (C) is doped, the misfit dislocation of the surface layer of the region 24 is markedly reduced and the base-emitter junction is not much affected adversely by the misfit dislocation occurring in the surface even when the areas of the emitter region 21 and silicon-germanium alloy ($Si_{1-x}Ge_x$) region 24 on the surface side are made equal to each other. Therefore, their areas are made to be equal in this modification. As a result, the step of widening the window of the emitter can be omitted and the fabrication process can therefore be simplified.

Figure 11A:
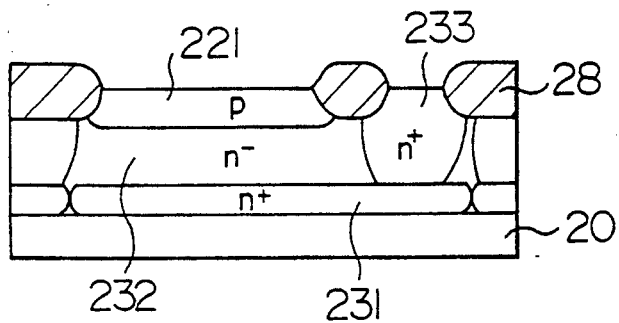
FIGS. 11A-11D are fabrication process diagrams of a bipolar transistor as still another modified embodiment of the embodiment of FIG. 4.
Figure 11B:
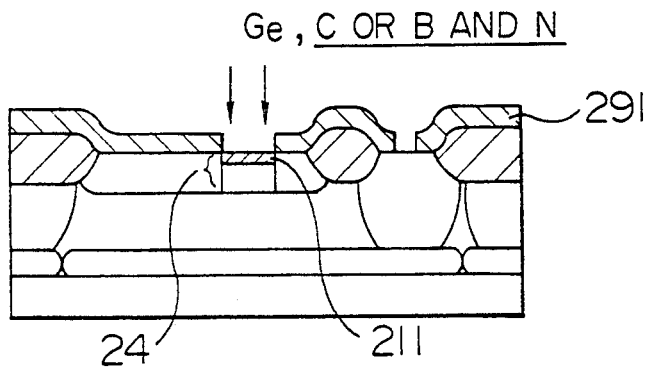
Figure 11C:
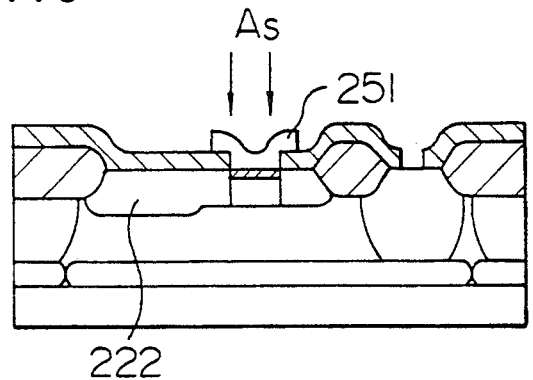
Figure 11D:
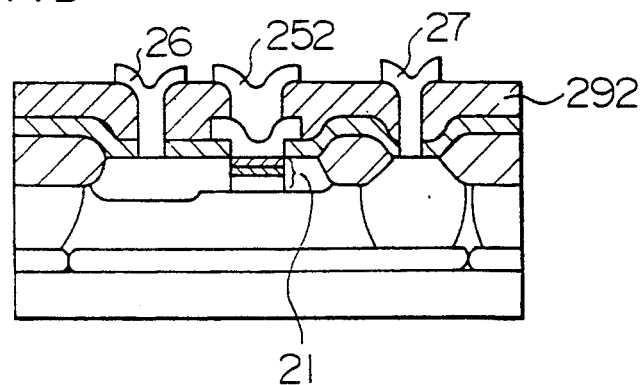

In FIG. 11A, the n+-buried layer 231 and the n−-collector layer 232 are formed on the Si substrate 20, and the field oxide film 28 is formed on field regions of the bipolar transistor. The p-base layer 221 and the n+-collector plug 233 are formed using the oxide film 28 as the mask. In FIG. 11B, after the oxide film 291 is formed and its predetermined region is opened, germanium is ion implanted. In FIG. 11C, the external base extension region 222 is formed and carbon (C) for mitigating the crystal strain is ion implanted without widening the window of the oxide film 291. Furthermore, annealing is carried out to effect crystallization. On the surface is formed the diffusion layer including $Si_{1-x}Ge_x$:C containing carbon (C) at this time. In FIG. 11D, polycrystalline silicon 251 is deposited and arsenic for doping the emitter is ion implanted. Polycrystalline silicon 251 is etched in such a manner as to cover the window. Furthermore, after the surface stabilization film 292 is deposited, annealing is carried out in order to activate the implanted ions and to shallowly diffuse arsenic in polycrystalline silicon into the base layer 221. Finally, the predetermined regions of the oxide film 291 for inter-level insulation and the surface stabilization film 292 are opened, and the emitter electrode 252 is formed on polycrystalline silicon 251. Furthermore, the base electrode 26 is formed on the external base extension region 222 and the collector electrode 27 is formed on the collector plug 233.

Incidentally, a greater effect can be expected by the use of two elements of boron (B) and nitrogen (N) having a smaller lattice constant than silicon in place of carbon (C).

Embodiment 3

FIG. 12A–12D show a fabrication process of the bipolar transistor according to still another embodiment.

Figure 12A:
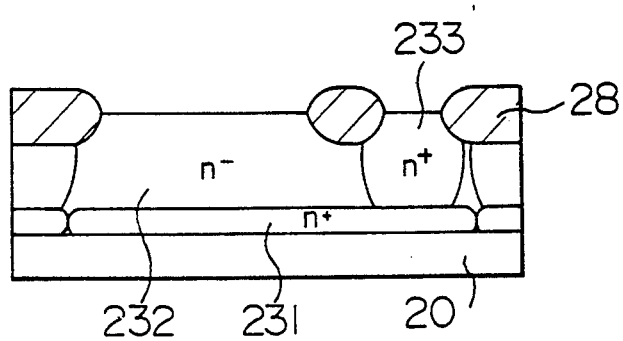
FIGS. 12A-12D are fabrication process diagrams of a bipolar transistor according to still another embodiment of the present invention.
Figure 12B:
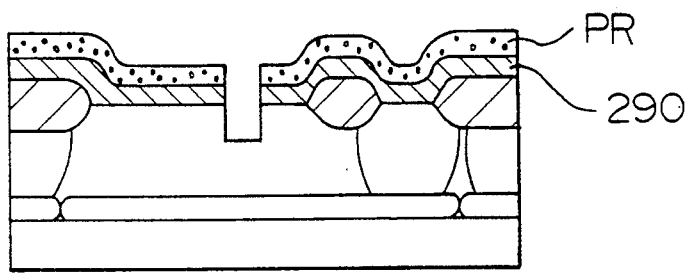
Figure 12C:
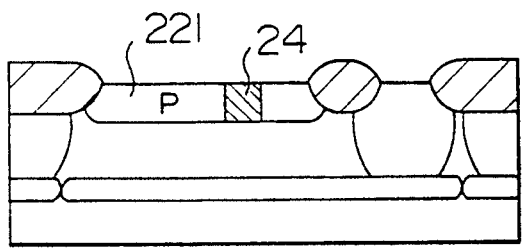
Figure 12D:
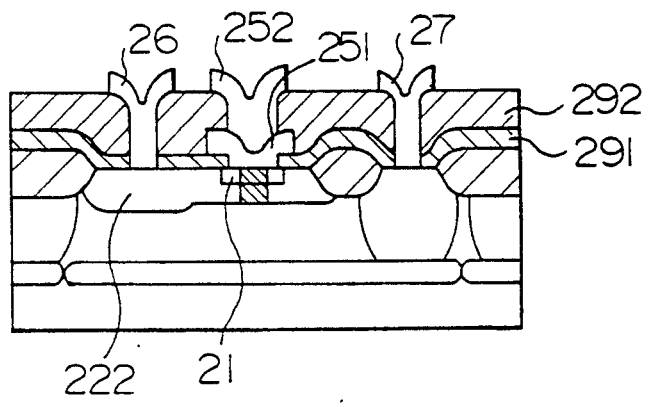

In FIG. 12A, the n+-buried layer 231 and the n−-collector layer 232 are formed on the Si substrate 20, and the field oxide film 28 is formed on field regions of the bipolar transistor. The n+-collector plug 233 is formed using the oxide film 28 as the mask. In FIG. 12B, after the oxide film 290 is formed on the n−-collector layer 232, a photoresist film PF is deposited thereon. Next, a window having a predetermined pattern is formed on the resist film PR and a protective oxide film 290 is etched back using this resist film PR as the mask. Furthermore, the n−-collector layer 232 below this oxide film 290 is etched so as to form a trench into the n−-collector layer 232. In FIG. 12C, after the resist film PR is removed, the silicon-germanium alloy ($Si_{1-x}Ge_x$) is grown selectively and epitaxially in such a manner as to bury the trench by a CVD process and to form the silicon-germanium alloy ($Si_{1-x}Ge_x$) layer 24. After the film 290 is once removed, the p-base layer 221 is formed. In FIG. 12D, the external base extension region 222 is formed and the oxide film 291 is formed once again. After the predetermined region is opened, polycrystalline silicon 251 is deposited, and arsenic is then ion-implanted for doping the emitter. Polycrystalline silicon is etched in such a manner as to cover the window. After the surface stabilization film 292 is deposited, annealing is carried out in order to activate the implanted ions and to shallowly diffuse arsenic in polycrystalline silicon into the base layer 221. Finally, the predetermined regions of the inter-level insulating oxide film 291 and surface stabilization film 292 are opened, and the emitter electrode 252 is formed on polycrystalline silicon 251. Furthermore, the base electrode 26 is formed on the external base extension region 222 and the collector electrode 27, on the collector plug 233.

Embodiment 4

Figure 13A:
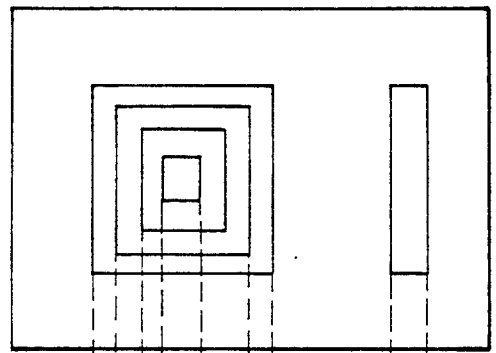
FIGS. 13A-13B are a plan view and a sectional view of a bipolar transistor according to still another embodiment of the present invention.
Figure 13B:
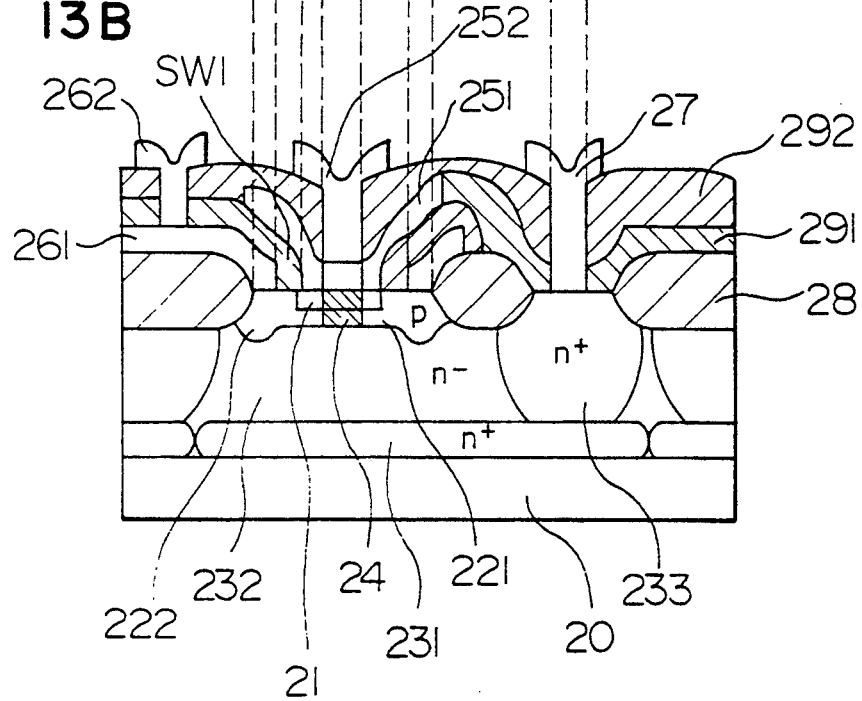
Figure 14A:
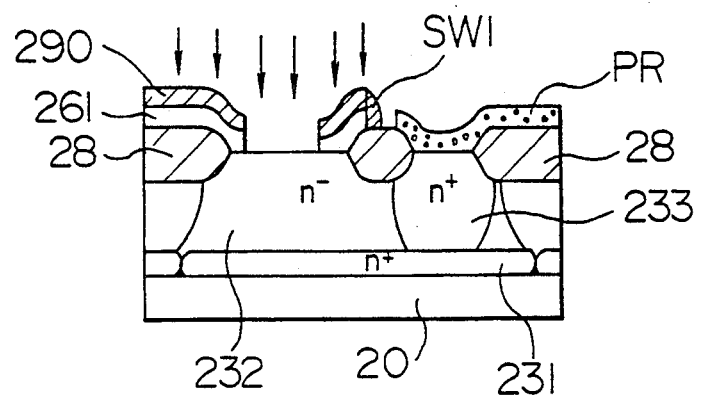
FIGS. 14A-14D are fabrication process diagrams of the bipolar transistor of FIG. 13.
Figure 14B:
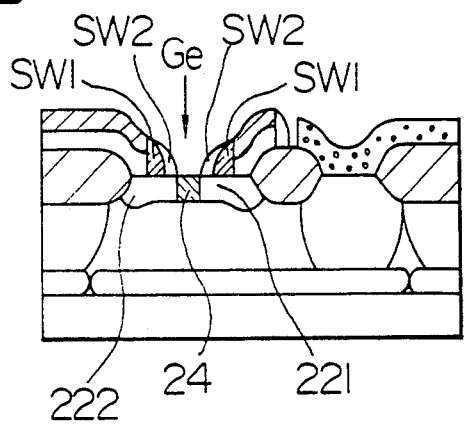

FIGS. 13A–13B show a structure of the bipolar transistor of still another embodiment of the present invention. FIG. 14A is a plan view and FIG. 14B is a sectional view. In comparison with FIG. 3A–3B, the characterizing feature of this embodiment resides in that the base region is formed by self-alignment. Therefore, the principal portions of the bipolar transistor, such as the base region 221, the base electrode extension region 222, etc, can be scaled down. The collector-base junction capacitance and the base resistance that impede the switching speed of the bipolar transistor can be reduced with this scale-down version.

FIGS. 14A–14D show a fabrication process of the bipolar transistor of the FIGS. 13A–13B embodiment.

Figure 14C:
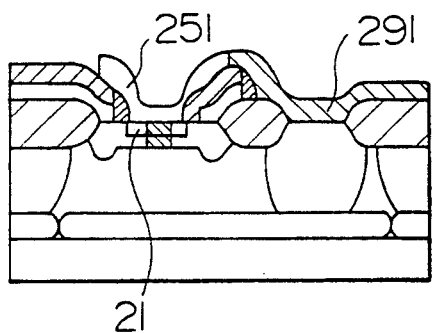
Figure 14D:
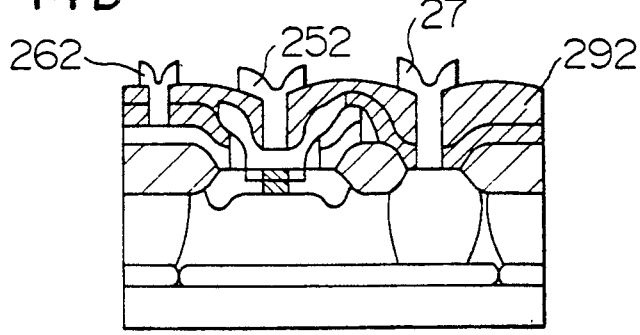

In FIG. 14A, the n+-buried layer 231 and the n−-collector layer 232 are formed on the Si substrate 20, and the field oxide film 28 is formed on field regions of the bipolar transistor. The n+-collector plug (e.g, collector lead-out region) 233 is formed using the oxide film 28 as the mask. Similarly, polycrystalline silicon 261 is deposited and oxide film 291 is deposited further thereon. After the predetermined window is formed, the resist film PR is deposited only onto the window of the n+-collector plug 233 and boron (B) for forming the base layer is ion implanted. In FIG. 14B, a sidewall SW1 including an oxide film is formed on the side surface of the window on the base layer 221 and a sidewall SW2 including a nitride film is formed on the sidewall SW1. Germanium is then ion implanted. In FIG. 14C, after the sidewall SW2 including the nitride film is removed, polycrystalline silicon 251 is deposited, and arsenic is ion implanted for doping the emitter region. Thereafter, polycrystalline silicon 251 is etched in such a manner as to cover the window. Thereafter, the base layer 221 and the emitter region 21 are formed in self-alignment by annealing. At this time is formed simultaneously the external extension region (e.g., extension region) 222 of the base region. In FIG. 14D, after the surface stabilization film 292 is deposited, the predetermined regions of the oxide film 291 for inter-level insulation and surface stabilization film 292 are opened, and the emitter electrode 252 is formed on polycrystalline silicon 251. The base electrode 262 is formed on the external base extension region 222 through polycrystalline silicon 261 and the collector electrode 27 is formed on the collector plug 233.

Embodiment 5

Figure 15A:
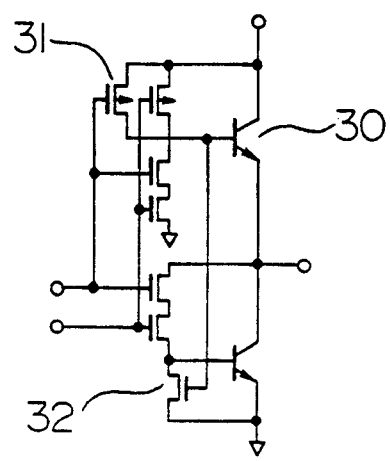
FIGS. 15A-15B are a BiCMOS basic gate (2NAND) circuit diagram using the bipolar transistor according to the present invention and a sectional view of a cell.
Figure 15B:
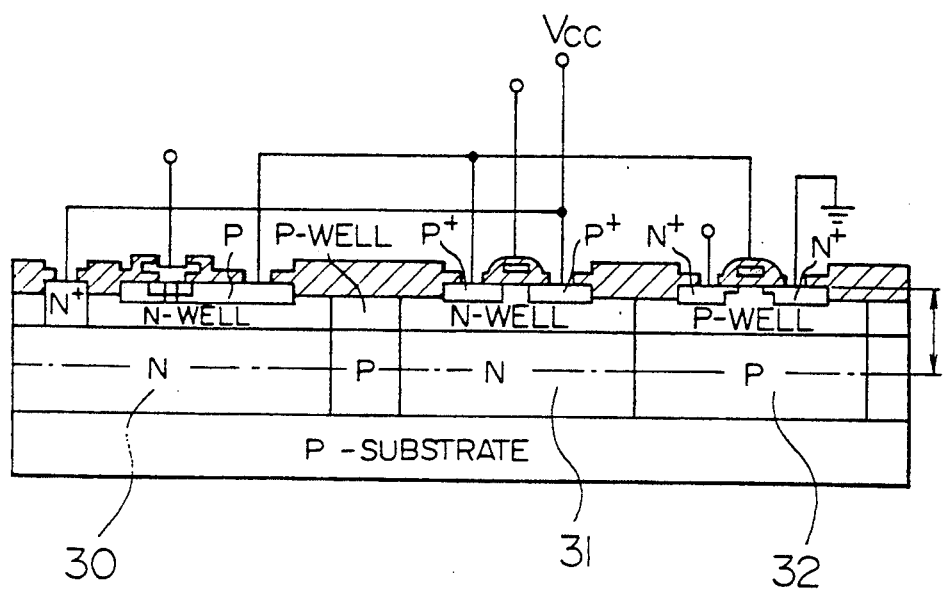

FIGS. 15A–15B show a BiCMOS basic gate (2NAND) circuit to which the bipolar transistor described above is applied. FIG. 15A is a circuit diagram and FIG. 15B shows a sectional structure of a cell. Reference numeral 30 represents the bipolar transistor described above, 31 is a p-channel MOS transistor and 32 is an n-channel MOS transistor. A higher speed circuit operation can be accomplished by using the bipolar transistors described above. Since the bipolar transistor can maintain its high speed performance even at a low power supply voltage, the basic gate circuit operates at a high speed even at a low power supply voltage.

Embodiment 6

Figure 16:
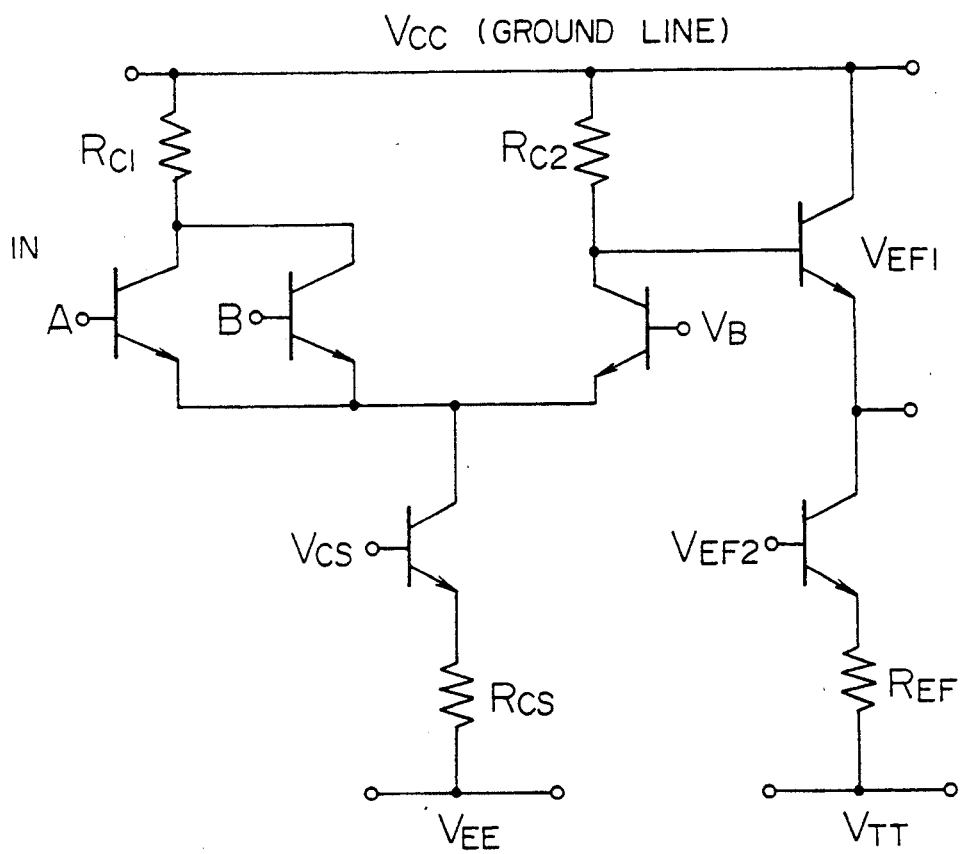
FIG. 16 is a circuit diagram for a two-input OR of an ECL (using only the OR side output) gate array using the bipolar transistor according to the present invention.

FIG. 16 is a circuit diagram of an ECL (using the output of only the OR side) gate array to which the bipolar transistors described above are applied. All of the six bipolar transistors are in accordance with the present invention. The ECL circuit is a high speed digital circuit which is constituted by emitter-follower transistors added in order to improve the load driving capacity (load drivability) to a current switch circuit. High speed performance of this circuit can be improved further by employing the bipolar transistors described above. Since the bipolar transistors can maintain their high speed performance even at a low power supply voltage, this basic gate circuit can operate at a high speed even at a low power supply voltage.

Embodiment 7

Figure 17A:
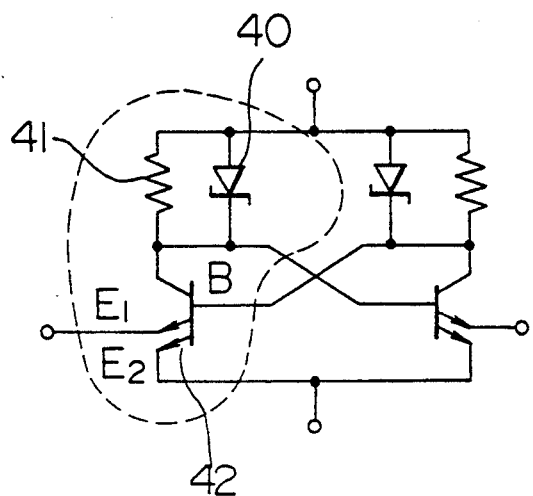
FIGS. 17A-17B are a circuit diagram of a clamp type memory cell using the bipolar transistor according to the present invention and a sectional view of a memory cell.
Figure 17B:
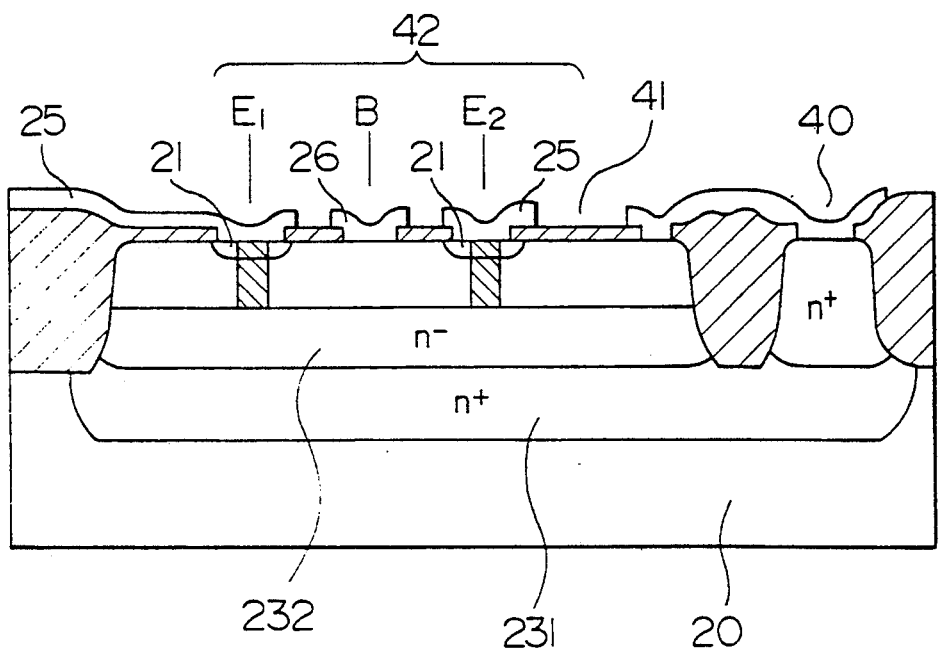

FIGS. 17A-17B explain a clamp type memory cell to which the bipolar transistor described above is applied. FIG. 17A is a circuit diagram and FIG. 17B shows a sectional structure. Reference numeral 40 in the drawings represents a Schottky barrier diode (SBD) and 41 is a load resistor. The operation speed of the memory cell can much be improved by using the bipolar transistor 42 described above. Since the bipolar transistor can maintain its high speed performance even at a low power supply voltage, the basic gate circuit operates at a high speed even at a low power supply voltage.

Embodiment 8

Figure 18:
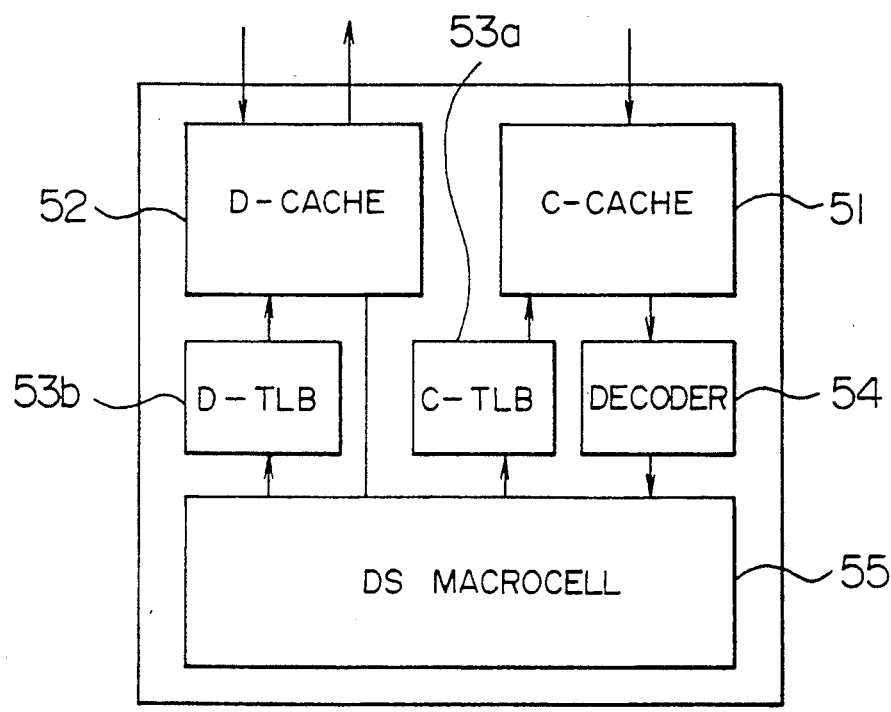
FIG. 18 is a plan view of a microprocessor to which the bipolar transistor according to the present invention is applied.
Figure 19:
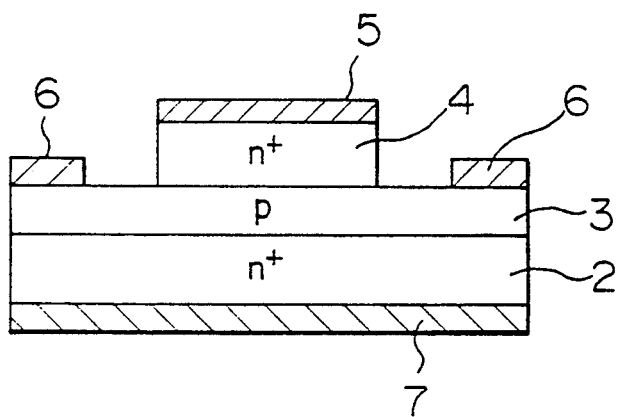
FIG. 19 is a schematic view of a heretofore known bipolar transistor.

FIG. 18 shows a structure of a microprocessor to which the bipolar transistors described above are applied. As is well known, the microprocessor includes a C-cache memory 51 for accepting an instruction, a decoder unit 54, a data structure (DS) microcell 55 for executing an operational processing on the basis of the output signal of the decoder unit and outputting a result, a D-cache memory 52 for storing the result of the operation, a data transistor look-aside buffer (C-TLB) 53a for designating the address for reading out the instruction next to the operation from the cache memory 51, and a D-TLB 53b for converting the logical address of the operation result into a physical address and designating a data storage address.

Microprocessors of the recent years use BiCMOS logic gate circuits for portions which execute the operations, other than memory cells. Therefore, a microprocessor having a higher operation speed can be accomplished by applying the bipolar transistors described above to these portions. Since the bipolar transistor can maintain its high speed performance even at a low power supply voltage, a low power consumption type microprocessor which operates at a high speed even when a power supply voltage drops can be accomplished.

In accordance with the structure according to the present invention the occurrence of the misfit dislocation at the emitter-base junction can be prevented by progressively narrowing the band gap from part of the emitter region side into the base region side. Therefore, the degradation of the electrical characteristics on the hetero-interface, that has been the problem with the prior art, can be eliminated and a higher operation speed of the bipolar transistor can be realized. The higher operation speed of the bipolar transistor can be realized, also, by the effect of the drift field since the band gap in the base region is changed.

The barrier height of the valence band near the emitter-base junction becomes greater by doping carbon (C) having the function of widening the band gap or boron (B) and nitrogen (N) having smaller atomic radius than silicon (Si) into the emitter region side. As a result, the current gain can be improved and the higher operation speed of the bipolar transistor is promoted.

The silicon-germanium alloy ($Si_{1-x}Ge_x$) having a dimension substantially equal to, or below, that of the emitter region is disposed immediately below and inside the emitter region and, consequently, the silicon-germanium alloy ($Si_{1-x}Ge_x$) is localized. As a result, the density of the misfit dislocation due to the lattice mismatch can be reduced and the influences of the misfit dislocation on the electrical characteristics of the bipolar transistor can be mitigated.

The area of the emitter region on the substrate surface is made greater than the area of the silicon-germanium alloy ($Si_{1-x}Ge_x$) region, so that the emitter-base junction can be spaced apart from the misfit dislocation occurring on the surface of the silicon-germanium alloy ($Si_{1-x}Ge_x$) region and the degradation of the electrical characteristics of the bipolar transistor due to the misfit dislocation can be suppressed.

Since carbon (C) is an element of the same Group IV as silicon and germanium and is electrically intrinsic and since it has a smaller lattice constant than silicon, doping of carbon (C) into the substrate surface mitigates the strain resulting from the lattice mismatch between silicon and germanium and can suppress the occurrence of the misfit dislocation that will otherwise occur on the surface of the silicon-germanium alloy region.

Two elements having ion bondability (such as boron (B) and nitrogen (N)) make re-construction of the silicon-germanium alloy much more easier than the covalence bondable element having a high bonding power, i.e. carbon (C). Therefore, doping of the two elements having a smaller lattice constant than silicon into the substrate surface provides a greater suppression effect of the misfit dislocation than doping of carbon.

In the silicon-germanium base lateral hetero-junction bipolar transistor, widening of the width of the substrate surface layer of the base region spaces apart the emitter-base junction and the base-collector junction away from the misfit dislocation, suppresses the occurrence of any excessive current at the emitter-base junction, and reduces the occurrence of the leakage current at the base-collector junction.

What is claimed is:

1. A bipolar transistor including a collector region of a first conductivity type, a base region of a second conductivity type, opposite to said first conductivity type, which forms a collector-base junction at an interface between said base region and said collector region, and an emitter region of said first conductivity type which forms a base-emitter junction at an interface between said emitter region and said base region, wherein portions of said emitter region and said base region in proximity of said base-emitter junction are formed of silicon-germanium alloy, and wherein the concentration of the germanium component of said silicon-germanium alloy in each of said portions is increasing along a direction from said emitter region to said base region.

2. A bipolar transistor according to claim 1, wherein at least one element having a smaller lattice constant that silicon is contained in a part of the portion extending from an outer surface of said emitter region to the base-emitter junction.

3. A bipolar transistor according to claim 1, wherein said base and emitter regions are formed in an epitaxial region which is provided on a semiconductor substrate.

4. A bipolar transistor according to claim 1, wherein said collector, base and emitter regions are formed in a semiconductor body which includes as a base layer a semiconductor substrate.

5. A bipolar transistor according to claim 1, wherein the portions of said emitter and base regions, formed of silicon-germanium alloy, are extended inwardly as contiguously formed semiconductor portions from an outer surface of said emitter region toward the base-emitter junction.

6. A bipolar transistor according to claim 5, wherein said at least one element includes carbon.

7. A bipolar transistor according to claim 5, wherein at least one element having a smaller lattice constant than silicon is contained in a part within said emitter region, of the contiguously formed portions, which are extended inwardly from the outer surface of said emitter but not reaching the collector region.

8. A bipolar transistor according to claim 7, wherein said element having a smaller lattice constant than silicon is at least one element selected from the group essentially consisting of carbon, boron and nitrogen.

9. A bipolar transistor according to claim 8, wherein the contiguously formed portions cover an area, with respect to a plan view, smaller than an area of said emitter region at the surface thereof.

10. A bipolar transistor according to claim 8, wherein the contiguously formed portions cover an area, with respect to a plan view, substantially equal to an area of said emitter region at the surface thereof.

11. A bipolar transistor according to claim 7, wherein said base and emitter regions are formed in an epitaxial region which is provided on a semiconductor substrate.

12. A bipolar transistor according to the claim 1, wherein the portions of said emitter and base region, formed of silicon-germanium alloy, are extended inwardly as contiguously formed semiconductor portions from an outer surface of said emitter region toward said collector region.

13. A bipolar transistor according to claim 12, wherein said element having a smaller lattice constant than silicon is at least one element selected from the group essentially consisting of carbon, boron and nitrogen.

14. A bipolar transistor according to claim 12, wherein said at least one element includes carbon.

15. A bipolar transistor including a collector region of a first conductivity type, a base region of a second conductivity type, opposite to said first conductivity type, which forms a collector-base junction at an interface between said base region and said collector region, and an emitter region of said first conductivity type which forms a base-emitter junction at an interface between said emitter region and said base region, wherein each of said base region and said emitter region includes, with respect to a plan view, a relatively central portion which is formed of silicon-germanium alloy and a peripheral portion which surrounds said central portion and is formed of silicon, and wherein the concentration of the germanium component of said silicon-germanium alloy in the central portion of each of said base region and said emitter region is increasing along a direction extending from said emitter region to said base region.

16. A bipolar transistor according to claim 15, wherein the central portions, formed of silicon-germanium alloy, of said base and emitter regions are contiguous portions extending to said collector region.

17. A bipolar transistor according to claim 16, wherein at least one element having a smaller lattice constant than silicon is contained in a part of the contiguously formed central portion extending from an outer surface of said emitter region to the base-emitter junction.

18. A bipolar transistor according to claim 17, wherein said element having a smaller lattice constant than silicon is at least one element selected from the group essentially consisting of carbon, boron and nitrogen.

19. A bipolar transistor according to claim 17, wherein said at least one element includes carbon.

20. A bipolar transistor according to claim 17, wherein said at least one element includes both boron and nitrogen.

21. A bipolar transistor according to claim 15, wherein at least one element having a smaller lattice constant than silicon is contained in a part of the central portion extending from an outer surface of said emitter region to the base-emitter junction.

22. A bipolar transistor according to claim 21, wherein said element having a smaller lattice constant than silicon is at least one element selected from the group essentially consisting of carbon, boron and nitrogen.

* * * * *